United States Patent
Olgaard et al.

[19]

[11] Patent Number: 6,028,493

[45] Date of Patent: Feb. 22, 2000

[54] ELIMINATION OF BANDPASS FILTER AFTER QUADRATURE MODULATOR IN MODULATION SYNTHESIZER CIRCUIT

[75] Inventors: Christian V. Olgaard, Sunnyvale; Benny Madsen, Los Altos, both of Calif.

[73] Assignee: National Semiconductor Corporation, Santa Clara, Calif.

[21] Appl. No.: 09/064,227

[22] Filed: Apr. 21, 1998

[51] Int. Cl.[7] .............................. H03C 3/00; H04L 27/20
[52] U.S. Cl. ........................................... 332/103; 375/308
[58] Field of Search .................................. 332/103–105; 375/298, 308

[56] References Cited

U.S. PATENT DOCUMENTS

| | | | |
|---|---|---|---|
| 4,360,788 | 11/1982 | Erps et al. ............................... | 331/1 A |
| 4,870,384 | 9/1989 | Thomas ................................... | 332/123 |
| 5,412,951 | 5/1995 | Nystrom et al. ......................... | 332/103 |
| 5,424,687 | 6/1995 | Fukuda ..................................... | 331/11 |

*Primary Examiner*—David Mis
*Attorney, Agent, or Firm*—Skjerven, Morrill, MacPherson, Franklin and Friel; Michael J. Halbert

[57] ABSTRACT

A modulation synthesizer circuit produces a fixed intermediate frequency unmodulated signal without harmonics aliasing back into the transmit spectrum, thus, eliminating the need for a bandpass filter. The modulation synthesizer circuit includes a phase shifter placed before the down conversion mixer. The phase shifter may be placed outside the modulation synthesizer loop such that the phase shifter produces quadrature carrier wave signals to the down conversion mixer. In the alternative the phase shifter may be kept within the modulation synthesizer loop and produce quadrature modulated transmit signals to the down conversion mixer. Any harmonic frequencies generated by the phase shifter are harmonics of the carrier wave signal or modulated transmit signal. Thus, with the appropriate choice of carrier wave signal or modulated transmit signal, any harmonics generated by the phase shifter can be prevented from aliasing back into the transmit spectrum and therefore need not be filtered. Consequently, the bandpass filter typically found after the quadrature modulator can be eliminated.

29 Claims, 3 Drawing Sheets

6,028,493

ELIMINATION OF BANDPASS FILTER AFTER QUADRATURE MODULATOR IN MODULATION SYNTHESIZER CIRCUIT

FIELD OF THE INVENTION

The present invention relates to modulation synthesizer circuits (closed loop modulation of voltage controlled oscillator), and more particularly to a modulation synthesizer circuit that eliminates harmonics at the in-band intermediate frequency that alias back into transmit spectrum at the voltage controlled oscillator.

BACKGROUND OF THE INVENTION

Modulation synthesizer circuits are commonly used in radio frequency (transceivers) transmitters. In conventional modulation synthesizer circuits, harmonic frequencies generated at the in-band intermediate frequency (IF) will alias back into the transmit spectrum at the voltage controlled oscillator due to the inherent sampling/limiting in the phase-lock loop up converter. Thus, conventional modulation circuits require the use of a bandpass filter to filter out the undesirable harmonic frequencies at the intermediate frequency. However, bandpass filters typically consist of bulky and expensive components such as capacitors and inductors. Consequently, the use of a bandpass filter to filter harmonic frequencies increases the cost and complexity of the modulation synthesizer circuit. Moreover, because of the associated size and space demands of the components required in bandpass filters, it is difficult to place the entire modulation synthesizer circuit on a single integrated circuit.

A block diagram of a conventional modulation synthesizer circuit 10 using a bandpass filter 70 is illustrated in FIG. 1. Modulation synthesizer circuit 10 includes a transmit voltage controlled oscillator (VCO) 25 which delivers a modulated spectrum to output terminal OUT as well as to a down conversion mixer 40. The local oscillator (LO) input to the mixer 40 is driven by a frequency synthesizer 30, which has a phase-locked loop circuit 32 and a voltage controlled oscillator 34. Frequency synthesizer 30 produces a carrier wave signal as LO input to down conversion mixer 40. The output of down conversion mixer 40 will be a copy of the modulated spectrum centered at an IF frequency that is the difference between the center frequency of the modulated signal from transmit VCO 25 and the frequency generated by frequency synthesizer 30.

A phase shifter 50 is conventionally located after mixer 40, within the modulation synthesizer loop 80. Phase shifter 50 receives the IF modulated signal from mixer 40 and produces two fixed IF signals having the same frequency but that are 90 degrees out of phase with each other, otherwise known as fixed IF quadrature signals.

The two fixed IF quadrature signals from phase shifter 50 are received by a quadrature modulator circuit 60, which produces a signal with a fixed IF unmodulated frequency. Quadrature modulator circuit 60 includes two mixers 62 and 64, as well as a summing circuit 66. Quadrature modulator circuit 60 also receives an in-phase base band signal at terminal I as well as a quadrature base band signal at terminal Q, which is 90 degrees out of phase with the in-phase base band signal. The in-phase base band signal and quadrature base band signal at I and Q input terminals, respectively, are complex conjugates of the modulated input spectrum produced by phase shifter 50. Thus, quadrature modulator circuit 60 produces a fixed IF unmodulated signal at its output terminal. The fixed unmodulated signal is then filtered by a anti-aliasing bandpass filter 70.

Modulation synthesizer circuit 10 also includes a wide band phase-lock loop (PLL) circuit 20 with an input terminal REF, which receives a reference signal typically generated by an IF synthesizer or from a crystal. Wide band PLL circuit 20 has a second input terminal FEEDBACK, which receives the fixed IF unmodulated signal from the output of quadrature modulator 60 filtered by a bandpass filter 70. Wide band PLL circuit 20 compares the two input signals by dividing the reference signal by R (an integer) and the fixed IF unmodulated carrier wave signal by N, and produces an output signal having a voltage level that ensures that the phase difference between the two signals is minimized. The control input terminal of transmit VCO 25 receives the output signal from wide band PLL circuit 20 after it is filtered by a loop filter 22. The transmit VCO 25 then up converts the signal received from loop filter 22, which results in the modulated spectrum at the output terminal of transmit VCO 25.

If a change in frequency is imposed on the signals at the I and/or Q input terminals, the frequency of the fixed unmodulated signal produced by quadrature modulator 60 will change. Consequently, there will be a phase difference between the signals at the input terminals of the wide band PLL circuit 20. The wide band PLL circuit 20 will then generate an output signal which will change the frequency of the modulated spectrum generated by transmit VCO 25. The frequency of the modulated spectrum generated by transmit VCO 25 will be such that the IF modulated signal produced by mixer 40 will be the complex conjugate of the new frequency imposed at the I and/or Q input terminals.

Similarly, a change in the frequency produced by frequency synthesizer 30 will force the frequency at transmit VCO 25 to change correspondingly, because the wide band PLL 20 will force the FEEDBACK input to remain at a fixed frequency. Therefore, the center frequency of the modulated transmit signal at OUT can be changed by changing the LO frequency produced by frequency synthesizer 30.

Unfortunately, phase shifter 50 does not only generate output signals at the IF frequency, but also generates harmonics of the fixed IF frequency, as shown in FIG. 2. FIG. 2 is a graph showing the spectrum 82 produced by phase shifter 50 at the IF frequency as well as the spectra 84, 86 at third and fifth harmonics of the IF frequency, respectively. The instantaneous IF frequency is offset from the output of the quadrature modulator 60 by the complex conjugate frequency generated by the signals received at the I and Q input terminals, so the frequency component of the third harmonic will be three times the complex conjugate frequency away relative to three times the frequency of the signal produced by quadrature modulator 60. Similarly, the fifth harmonic will be five times further away relative to five times the frequency of the signal produced by quadrature modulator 60. Therefore the spectra at the harmonics will become wider as shown in FIG. 2.

Although quadrature modulator circuit 60 produces a fixed IF unmodulated signal, it also modulates the harmonic frequencies generated by phase shifter 50. However, because the spectrum at the harmonic frequencies is now wider, as shown in FIG. 2, the spectrum at the harmonic frequencies does not correspond to the modulation imposed by the signals received at the I and Q input terminals. Consequently, quadrature modulator circuit 60 can no longer remove the modulation, as shown in FIG. 3. FIG. 3 is a graph showing the spectrum 88 produced by quadrature modulator circuit 60 at its output as well as the spectra 90, 92 produced at the third and fifth harmonic frequencies, respectively. As shown in FIG. 3, the quadrature modulator 60 produces a fixed unmodulated signal at the IF frequency, but modulated signals at the third and fifth harmonics of the IF frequency.

The signals at the IF frequency as well as its harmonic frequencies are received by wide band PLL circuit 20, which acts similar to a fast sampling device with a sampling rate equal to the phase detector frequency. Thus, the signals at the harmonics of the IF frequency produced by quadrature modulator circuit 60 will alias into the transmit spectrum, causing distortion of the desired spectrum, as shown in FIG. 4. FIG. 4 is a graph showing the spectrum generated by wide band PLL circuit 20 in which the spectra 90, 92 at the third and fifth harmonics, shown in FIG. 3, are aliased into the transmit spectrum at the transmit frequency $f_{TX}$. It is understood that the spectra illustrated in FIGS. 2, 3, and 4 relate to one particular given modulation standard, and that other spectra will exist for other modulation standards.

Consequently, an anti-aliasing bandpass filter 70 is required to remove the spectra at the harmonics of the IF. However, an anti-aliasing bandpass filter with sufficient attenuation of the harmonic components has approximately four inductors and four capacitors, which are bulky and expensive in both cost and real estate when placed on a silicon chip. Thus, when modulation synthesizer circuit 10 is placed on a single silicon integrated circuit, bandpass filter 70 is generally located externally.

SUMMARY

A modulation synthesizer circuit in accordance with the present invention places the phase shifter before the quadrature down conversion mixer circuit. Consequently, the harmonics produced by the phase shifter are outside the IF base band and, therefore, do not need to be filtered. Thus, a bandpass filter is not necessary in the modulation synthesizer circuit of the present invention.

A modulation synthesizer circuit in accordance with one embodiment of the present invention removes the phase shifter from the modulation synthesizer loop and places the phase shifter between the local oscillator and the modulation synthesizer loop. The phase shifter receives a carrier wave signal from the local oscillator and produces two carrier wave signals phase shifted 90 degrees relative to each other. In another embodiment the local oscillator produces two quadrature carrier wave signals thus obviating the use of a phase shifter. Although the phase shifter produces higher harmonic signals, these are harmonics of the carrier wave signal produced by the local oscillator, so by correct frequency planning, it can be ensured that the harmonics will not exist at frequencies where they alias back into the transmit spectrum. When this is done, the transmit PLL's loop filter will filter the harmonics, so they will not cause distortion of the modulated spectrum at the VCO.

A quadrature down conversion mixer circuit coupled to the phase shifter down converts the two quadrature carrier wave signals, producing two modulated IF quadrature signals. A quadrature modulator circuit receives the two fixed IF quadrature signals from the quadrature down conversion mixer circuit and produces a fixed IF unmodulated signal with only the harmonics produced by the quadrature modulator itself. The unfiltered fixed IF unmodulated signal is then provided to the wide band phase-locked loop circuit.

In an alternative embodiment of the present invention, the phase shifter is located between the transmit voltage controlled oscillator and the quadrature down conversion mixer circuit. Thus, the phase shifter shifts the phase of the modulated transmit signal prior to being received by the quadrature down conversion mixer circuit. A single carrier wave signal from the local osciallator may be used in this embodiment.

By moving the phase shifter so that it is located prior to the quadrature down conversion mixer circuit, the phase shifter can be prevented from generating harmonics that will alias back into the transmit spectrum at the output of the transmit VCO by using the appropriate frequency for the carrier wave signal. Consequently, the need for a bandpass filter after the quadrature modulator circuit is eliminated.

BRIEF DESCRIPTION OF THE DRAWINGS

The above and other features, aspects, and advantages of the present invention will become better understood with regard to the following description, appended claims, and accompanying figures, where:

DETAILED DESCRIPTION

Figure 5:
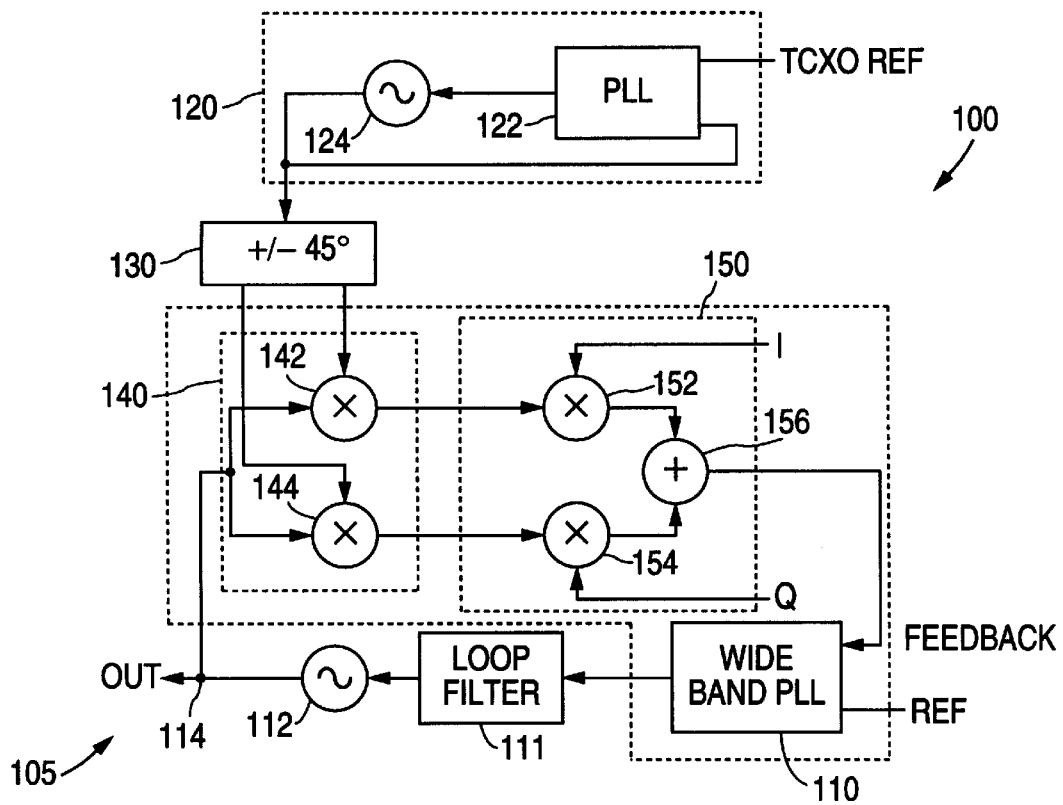
FIG. 5 is a block diagram illustrating an embodiment of the modulation synthesizer circuit of the present invention in which the phase shifter is located before the down conversion mixer circuit outside the modulation synthesizer loop.
Figure 2:
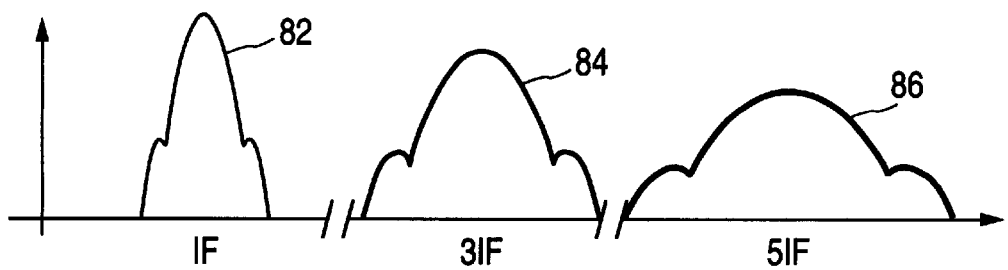
FIG. 2 is a graph showing the spectrum produced by phase shifter 50 at the IF frequency as well as the spectra at third and fifth harmonics of the IF frequency.
Figure 3:
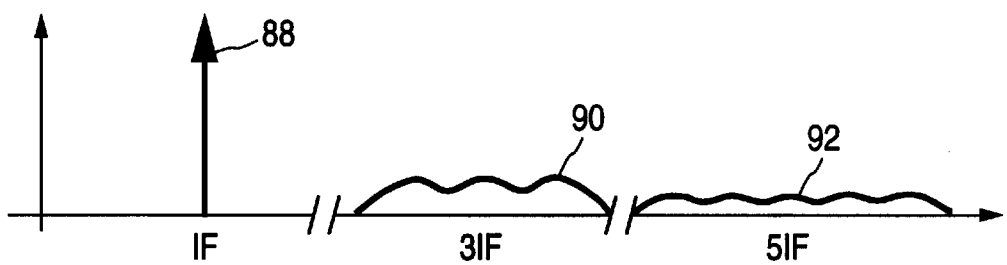
FIG. 3 is a graph showing the spectrum produced by quadrature modulator circuit 60 at the output of the quadrature modulator as well as the spectra produced at the third and fifth harmonic frequencies.
Figure 4:
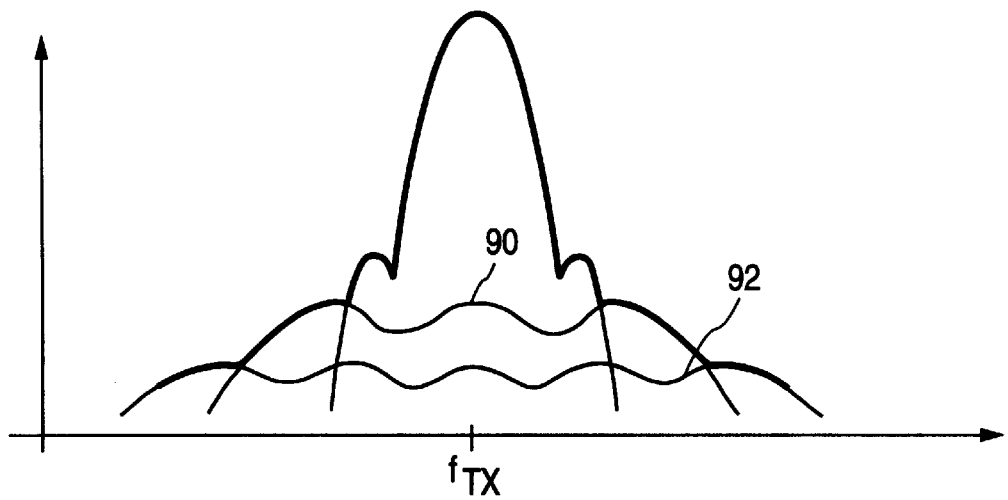
FIG. 4 is a graph showing the spectrum generated by wide band PLL circuit 20 in which the spectra at the third and fifth harmonics are aliased into the transmit spectrum.

FIG. 5 illustrates a modulation synthesizer circuit 100 in accordance with an embodiment of the present invention. Modulation synthesizer circuit 100 includes a modulation synthesizer loop 105, a local oscillator such as frequency synthesizer circuit 120, and a phase shifter 130. Modulation synthesizer circuit 100 may be integrated entirely onto a single silicon chip or components, such as the transmit voltage controlled oscillator 112 and loop filter 111, may be located externally, i.e., off the chip.

Modulation synthesizer loop 105 includes a wide band phase-locked loop (PLL) circuit 110. Wide band PLL circuit 110 is a conventional PLL circuit including dividers and phase detectors or mixers. Wide band PLL circuit 110 receives an intermediate frequency (IF) reference signal at terminal REF. The reference signal is an IF signal generated externally to modulation synthesizer circuit 100. The actual generation of the IF reference signal received at input terminal REF is accomplished in a conventional manner by the use of a frequency synthesizer, a crystal, or by other means well known to those of ordinary skill in the art.

Wide band PLL circuit 110 also receives a fixed IF unmodulated signal at the input terminal FEEDBACK. The generation of the fixed IF unmodulated signal is described below. Wide band PLL circuit 110 compares the IF reference signal and the fixed IF unmodulated signal and generates an output signal having a voltage ensuring minimal phase difference between the two input signals. The output signal is provided to a loop filter 111 and then to a transmit voltage controlled oscillator 112.

Transmit voltage controlled oscillator 112 is part of modulation synthesizer loop 105 and is located externally to the modulation synthesizer circuit 100, i.e., off the chip. However, it is understood that transmit voltage controlled oscillator 112 may be integrated onto the chip as well. Transmit voltage controlled oscillator 112 produces a (digitally) modulated transmit signal. The modulated transmit signal is provided to an external power amplifier (not shown) via output terminal OUT as well as the remaining modulation synthesizer loop 105 via node 114.

A local oscillator or frequency synthesizer circuit 120 uses a PLL circuit 122 to produce a carrier wave signal at a desired frequency. The PLL circuit 122 includes a phase detector (or mixer) and dividers (not shown), as is well understood by those skilled in the art. In addition, frequency synthesizer circuit 120 includes a voltage controlled oscillator 124, which is integrated onto the same chip. It is understood, however, that voltage controlled oscillator 124 may also be located externally to the integrated circuit. Moreover, all of frequency synthesizer 120 may be a separate component, i.e., not integrated on the same circuit.

The PLL circuit 122 conventionally compares the frequencies of two input signals; one of which is a reference signal from an external oscillator, such as a temperature-compensated crystal oscillator, at input terminal TCXO REF, and the other input signal is the carrier wave signal generated by frequency synthesizer circuit 120. The reference signal at input terminal TCXO REF is divided by a divider and the resulting signal drives one input of the phase detector (not shown). Similarly, the carrier wave signal generated by frequency synthesizer circuit 120 is also divided, and the resulting signal drives the other input to the phase detector. The PLL circuit 122 produces an output signal that ensures that the phase difference between the two signals is minimized. The output signal of PLL circuit 122 is filtered by a loop filter (not shown), and then used to control voltage controlled oscillator 124.

Based on the output signal from PLL circuit 122, voltage controlled oscillator 124 produces the carrier wave signal at the desired frequency. Any error in the frequency of the signal produced by voltage controlled oscillator 124 is corrected with an appropriate signal from PLL circuit 122. Thus, PLL circuit 122 phase locks the carrier wave signal produced by frequency synthesizer circuit 120 to the reference signal at input terminal TCXO REF. By changing the divide ratio of the divider dividing the frequency synthesizer circuit 120 output signal, the frequency of the frequency synthesizer circuit 120 can be changed.

The carrier wave signal from frequency synthesizer circuit 120 is received by a phase shifter 130, which is positioned outside the modulation synthesizer loop 105 prior to the quadrature down conversion mixer circuit 140. Phase shifter 130 produces two quadrature carrier wave signals with the same fundamental frequencies as the carrier wave signal produced by frequency synthesizer circuit 120. The two quadrature carrier wave signals produced by phase shifter 130, are phase shifted by an appropriate amount to produce signals that are 90 degrees out of phase with respect to each other. Of course, if desired phase shifter 130 may shift the signals to produce the 90 degree phase shift plus a phase shift of multiples of +/−180 degrees, i.e., 270 degrees, 450 degrees, etc., as one skilled in the art will understand. Consequently, as their name implies the two quadrature carrier wave signals are 90 degrees out of phase with respect to each other.

Phase shifter 130 also generates harmonic frequency signals. However, because phase shifter 130 is located between frequency synthesizer circuit 120 and modulation synthesizer loop 105, the harmonics generated by phase shifter 130 are harmonics of the carrier wave signal. Thus, with the appropriate choice of frequency for the carrier wave signal generated by frequency synthesizer circuit 120, the harmonic frequencies generated by phase shifter 130 will not exist at harmonics of the phase detector frequency of the wide band PLL 110.

Figure 6:
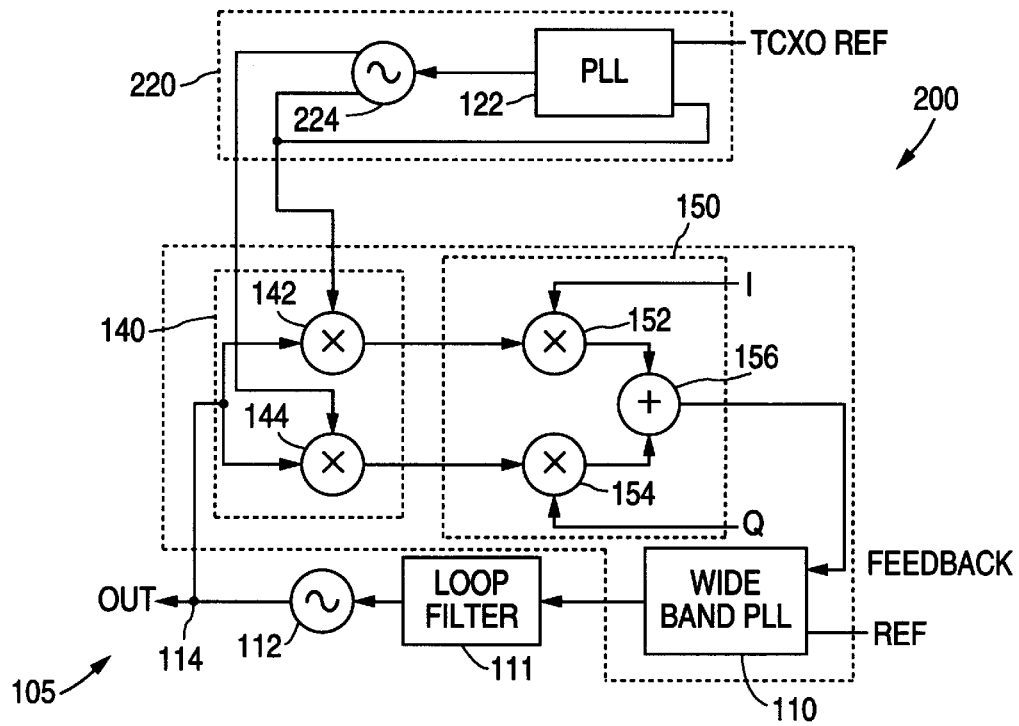
FIG. 6 is a block diagram illustrating an embodiment of the modulation synthesizer circuit of the present invention in which the phase shifter is removed.

FIG. 6 shows an alternative embodiment of the present invention, with like-designated elements being the same. The modulation synthesizer circuit 200 of FIG. 6 is similar to the modulation synthesizer circuit 100 of FIG. 5, however, phase shifter 130 is removed. As shown in FIG. 6, the voltage controlled oscillator 224 in frequency synthesizer circuit 220 has two output terminals, each carrying carrier wave signals. The two carrier wave signals have the same frequency, but are 90 degrees out of phase. Producing two quadrature carrier wave signals with a voltage controlled oscillator is well understood by those skilled in the art. Using a voltage controlled oscillator 224 to produce the two quadrature carrier wave signals, thus, obviates the need for a phase shifter.

The modulation synthesizer loop 105 of FIG. 5 also includes a quadrature down conversion mixer circuit 140. The two quadrature carrier wave signals produced by phase shifter 130, or from voltage controlled oscillator 224 in FIG. 6, are received at quadrature down conversion mixer circuit 140. Quadrature down conversion mixer circuit 140 includes two mixers 142 and 144, each receiving one of the quadrature carrier wave signals. The location of phase shifter 130 prior to quadrature down conversion mixer circuit 140 requires the use of both mixers 142 and 144. Mixers 142, 144 also receive the modulated transmit signal from transmit voltage controlled oscillator 112 via node 114. Mixers 142, 144 conventionally down convert the modulated spectrum at the transmit voltage controlled oscillator 112 to quadrature copies of the modulated transmit signal centered at a fixed IF frequency. Thus, quadrature down conversion mixer circuit 140 produces two modulated fixed IF quadrature signals.

The modulated fixed IF quadrature signals produced by quadrature down conversion mixer circuit 140 are received by quadrature modulator circuit 150, which conventionally removes the modulation from the signals. Thus, quadrature modulator circuit 150 produces a fixed IF unmodulated signal. Quadrature modulator circuit 150 includes two mixers 152, 154, which are connected to respective mixers 142 and 144 from quadrature down conversion mixer circuit 140. Quadrature modulation circuit 150 also receives an in-phase base band signal at input terminal I and a quadrature base band signal at input terminal Q. The signals at input terminals I and Q represent a complex representation of the modulated signal generated at the output signal of the transmit voltage controlled oscillator 112 at node 114. Terminal I is connected to mixer 152, while terminal Q is connected to mixer 154. Mixers 152 and 154 produce fixed IF unmodulated quadrature signals, which are received by a summing circuit 156. Summing circuit 156 combines the unmodulated quadrature signals and produces a fixed IF unmodulated signal. The fixed unmodulated IF signal is then received by wide band PLL circuit 110 via the terminal FEEDBACK.

Because phase shifter 130 is before quadrature down conversion mixer 140, the harmonics generated by phase shifter 130 are easily generated so they will not exist at harmonics of the phase detector of wide band PLL 110. Thus, the harmonics generated by phase shifter 130 do not require filtering by an anti-aliasing bandpass filter. Therefore, the harmonics that are generated by phase shifter 130 will be filtered by loop filter 111. Consequently, the bandpass filter that is used in the traditional architecture is advantageously eliminated reducing the cost and space required for a modulation synthesizer circuit.

Figure 7:
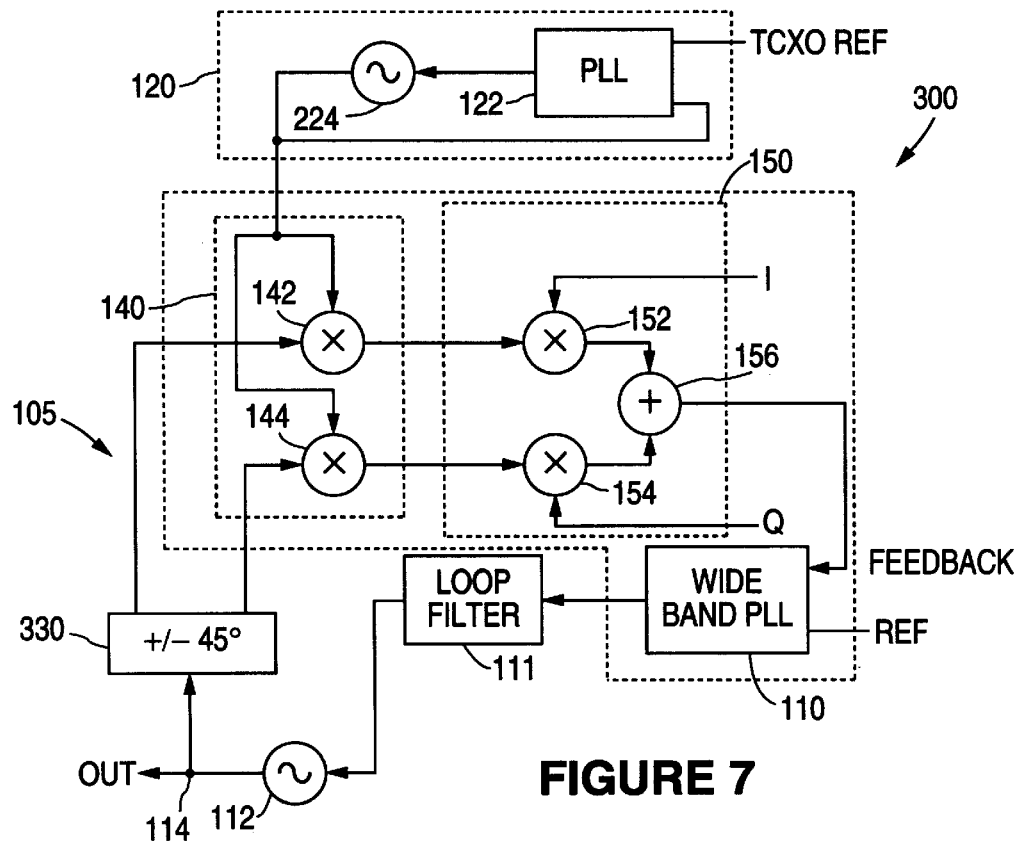
FIG. 7 is a block diagram illustrating an embodiment of the modulation synthesizer circuit of the present invention in which the phase shifter is located before the down conversion mixer circuit inside the modulation synthesizer loop.

FIG. 7 is a diagram of another embodiment of the present invention in which phase shifter 330 is located before quadrature down conversion mixer circuit 140. Modulation synthesizer circuit 300, shown in FIG. 7, is similar to circuit 100, shown in FIG. 5, with like designated elements being the same. In modulation synthesizer circuit 300, however, phase shifter 330, which is similar to phase shifter 130 shown in FIG. 5, is placed between transmit voltage controlled oscillator 112 and quadrature down conversion mixer circuit 140.

Figure 1:
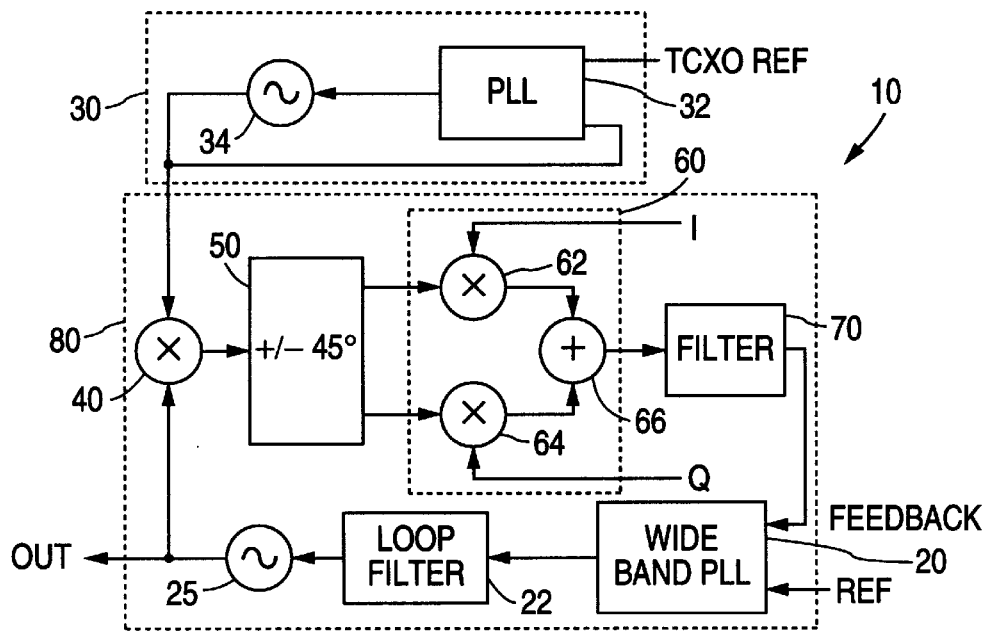
FIG. 1 is a block diagram illustrating a conventional modulation synthesizer circuit including a bandpass filter in the modulation synthesizer loop.

Phase shifter 330 shifts the phase of the modulated transmit signal produced by transmit voltage controlled oscillator 112 rather than shifting the phase of the carrier wave signal from frequency synthesizer circuit 120. Thus, quadrature down conversion mixer circuit 140 receives one carrier wave signal from frequency synthesizer circuit 120 and two quadrature modulated transmit signals with the same fundamental frequencies as the modulated transmit signal produced by transmit voltage controlled oscillator 112. Nevertheless, modulation synthesizer circuit 300 behaves similarly to circuit 100 shown in FIG. 1, in that with the appropriately generated modulated transmit signal from transmit voltage controlled oscillator 112, the harmonic frequencies generated by phase shifter 330 will not exist at harmonics of the phase detector frequency of the wide band PLL 110. Consequently, modulation synthesizer circuit 300 does not require an anti-aliasing bandpass filter.

Although the present invention has been described in considerable detail with reference to certain versions thereof, other versions are possible. For example, phase shifter 130 may be removed by generating two quadrature carrier wave signals directly from the voltage controlled oscillator 224 shown in FIG. 6. Further while the above description assumes that the entire described circuit, or most of it, is located on a single integrated circuit, it is understood that the present invention may also be implemented with only parts of the circuit integrated onto a chip, and that other parts of the circuit may be implemented off chip.

Also, some components are shown directly coupled to one another while others are shown coupled via intermediate components. In each instance the method of coupling establishes some desired electrical communication between two or more circuit nodes. Such coupling may often be accomplished using a number of circuit configurations, as will be understood by those of ordinary skill in the art. Therefore, the spirit and scope of the appended claims should not be limited to the description of the versions depicted in the figures.

What is claimed is:

1. A modulation synthesizer circuit comprising:
    a modulation synthesizer loop having a quadrature down conversion mixer, said quadrature down conversion mixer having a first input terminal, and a second input terminal; and
    a phase shifter having a first output terminal and a second output terminal, said first output terminal coupled to said first input terminal of said quadrature down conversion mixer and said second output terminal coupled to said second input terminal of said quadrature down conversion mixer.

2. The modulation synthesizer circuit of claim 1, wherein said quadrature down conversion mixer has a third input terminal, a first output terminal, and a second output terminal and wherein said modulation synthesizer loop further comprises:
    a quadrature modulator having a first input terminal coupled to said first output terminal of said quadrature down conversion mixer, a second input terminal coupled to said second output terminal of said quadrature down conversion mixer, a third input terminal receiving an in-phase base band signal, a fourth input terminal receiving a quadrature base band signal and an output terminal;
    a first phase-locked loop circuit having a first input terminal coupled to said output terminal of said quadrature modulator, a second input terminal receiving a reference signal, and an output terminal; and
    a first voltage controlled oscillator having an input terminal coupled to said output terminal of said first phase-locked loop circuit, and an output terminal coupled to said third input terminal of said quadrature down conversion mixer.

3. A modulation synthesizer circuit of claim 2, wherein said quadrature down conversion mixer comprises:
    a first down conversion mixer having a first input terminal coupled to said first output terminal of said phase shifter, a second input terminal coupled to said output terminal of said first voltage controlled oscillator circuit, and said first output terminal; and
    a second down conversion mixer having a first input terminal coupled to said second output terminal of said phase shifter, a second input terminal coupled to said output terminal of said first voltage controlled oscillator circuit, and said second output terminal.

4. A modulation synthesizer circuit of claim 2 further comprising a filter having an input terminal coupled to said output terminal of said first phase-locked loop circuit, and an output terminal coupled to said first voltage controlled oscillator.

5. The modulation synthesizer circuit of claim 2 further comprising:
    a local oscillator having an output terminal; and
    said phase shifter coupled to said output terminal of said local oscillator.

6. The modulation synthesizer circuit of claim 2, further comprising a local oscillator, said local oscillator comprising:
    a second phase-locked loop circuit having an input terminal receiving a reference signal, a feedback terminal, and an output terminal; and
    a second voltage controlled oscillator coupled to said output terminal of said second phase locked loop circuit, said second voltage controlled oscillator having an output terminal coupled to said feedback terminal of said second phase-locked loop circuit and coupled to said quadrature down conversion mixer.

7. The modulation synthesizer circuit of claim 6, wherein said second voltage controlled oscillator comprises said phase shifter, wherein a first output terminal of said second voltage controlled oscillator is coupled to said first input terminal of said quadrature down conversion mixed and a second output terminal of said second voltage controlled oscillator is coupled to said second input terminal of said quadrature down conversion mixer.

9

8. The modulation synthesizer circuit of claim 1, wherein said quadrature down conversion mixer has a third input terminal, a first output terminal, and a second output terminal and wherein said modulation synthesizer loop further comprises:
  a quadrature modulator having a first input terminal coupled to said first output terminal of said quadrature down conversion mixer, a second input terminal coupled to said second output terminal of said quadrature down conversion mixer, a third input terminal receiving an in-phase base band signal, a fourth input terminal receiving a quadrature base band signal and an output terminal;
  a first phase-locked loop circuit having a first input terminal coupled to said output terminal of said quadrature modulator, a second input terminal receiving a reference signal, and an output terminal; and
  a first voltage controlled oscillator having an input terminal coupled to said output terminal of said first phase-locked loop circuit, and an output terminal coupled to said phase shifter.

9. The modulation synthesizer circuit of claim 6, further comprising a local oscillator having an output terminal coupled to said third input terminal of said quadrature down conversion mixer.

10. The modulation synthesizer of claim 1, wherein said a modulation synthesizer loop having a quadrature down conversion mixer is integrated onto one silicon chip.

11. A modulation synthesizer circuit comprising:
  a quadrature circuit receiving an input signal and producing two quadrature signals; and
  a modulation synthesizer loop comprising a quadrature down conversion mixer, said quadrature down conversion mixer receiving said two quadrature signals, said modulation synthesizer loop producing a modulated transmit signal.

12. The modulation synthesizer circuit of claim 11, wherein said two quadrature signals are two quadrature carrier wave signals.

13. The modulation synthesizer circuit of claim 12, wherein said quadrature circuit producing two quadrature carrier wave signals comprises:
  a local oscillator receiving a reference signal and producing a carrier wave signal; and
  a phase shifter receiving said carrier wave signal and producing two quadrature carrier wave signals having the same frequency as said carrier wave signal.

14. The modulation synthesizer circuit of claim 13, wherein said local oscillator comprises:
  a second phase-locked loop circuit receiving said reference signal and said carrier wave signal, said second phase-locked loop circuit producing an output signal based on the difference between said reference signal and said carrier wave signal; and
  a second voltage controlled oscillator receiving said output signal of said second phase-locked loop circuit, said second voltage controlled oscillator producing said carrier wave signal.

15. The modulation synthesizer circuit of claim 12, wherein said quadrature circuit producing two quadrature carrier wave signals comprises:
  a second phase-locked loop circuit receiving a reference signal and a carrier wave signal and producing an output signal based on the difference between said reference signal and said carrier wave signal; and

10 a second voltage controlled oscillator receiving said output signal of said second phase-locked loop circuit, said second voltage controlled oscillator producing two quadrature carrier wave signals wherein one of said two quadrature carrier wave signals is provided to said second phase-locked loop circuit.

16. The modulation synthesizer circuit of claim 12, wherein said modulation synthesizer loop comprises:
  said quadrature down conversion mixer receiving said two quadrature carrier wave signals and said modulated transmit signal, said quadrature down conversion mixer mixing said two quadrature carrier wave signals with said modulated transmit signal to produce two modulated signals within an IF frequency;
  a quadrature modulator receiving said two modulated signals within said IF frequency, a first base band signal and a second base band signal and producing a fixed IF unmodulated signal having no harmonics in the IF frequency, wherein said first base band signal and second base band signal have the same frequency and differ in phase by approximately ninety degrees;
  a phase-locked loop circuit receiving said fixed IF unmodulated signal and an IF reference signal, and producing an output signal based on the difference between said fixed IF unmodulated signal and said IF reference signal; and
  a voltage controlled oscillator receiving said output signal from said phase-locked loop circuit and producing said modulated transmit signal.

17. The modulation synthesizer circuit of claim 16, wherein said quadrature down conversion mixer is comprised of:
  a first down conversion mixer receiving one of said two quadrature carrier wave signals and said modulated transmit signal and producing one of said two modulated signals within said IF frequency; and
  a second down conversion mixer receiving the other of said two quadrature carrier wave signals and said modulated transmit signal and producing the other of said two modulated signals within said IF frequency.

18. The modulation synthesizer circuit of claim 16, wherein said quadrature modulator is comprised of:
  a third mixer receiving one of said two modulated signals within said IF frequency and said first base band signal and producing a first fixed IF unmodulated quadrature signal;
  a fourth mixer receiving the other of said two modulated signals within said IF frequency and said second base band signal and producing a second fixed IF unmodulated quadrature signal; and
  a summing circuit receiving said first and second fixed IF unmodulated quadrature signals and producing a fixed IF unmodulated signal having no harmonics in said IF frequency.

19. The modulation synthesizer circuit of claim 11, wherein said input signal to said quadrature circuit is said modulated transmit signal and said two quadrature signals are two quadrature modulated transmit signals, said modulation synthesizer circuit further comprising a local oscillator receiving a reference signal and producing a carrier wave signal.

20. The modulation synthesizer circuit of claim 19, wherein said modulation synthesizer loop comprises:
  said quadrature down conversion mixer receiving said two quadrature modulated transmit signals and said carrier wave signal, said quadrature down conversion mixer mixing said two quadrature modulated transmit signals with said carrier wave signal to produce two modulated signals within an IF frequency;

a quadrature modulator receiving said two modulated signals within said IF frequency, a first base band signal and a second base band signal and producing a fixed IF unmodulated signal having no harmonics in the IF frequency, wherein said first base band signal and second base band signal have the same frequency and differ in phase by approximately ninety degrees;

a phase-locked loop circuit receiving said fixed IF unmodulated signal and an IF reference signal, and producing an output signal based on the difference between said fixed IF unmodulated signal and said IF reference signal; and a voltage controlled oscillator receiving said output signal from said phase-locked loop circuit and producing said modulated transmit signal.

21. A method comprising:

receiving an IF reference signal;

providing two quadrature signals, wherein the two quadrature signals have the same frequency and differ in phase by approximately ninety degrees;

down converting said two quadrature signals to produce two fixed IF modulated signals having the same frequency and differing in phase by approximately ninety degrees, wherein said two fixed IF modulated signals do not have harmonics in the IF frequency;

producing a fixed IF unmodulated signal based on said two fixed IF modulated signals, an in-phase base band signal and a quadrature base band signal; and phase locking said fixed IF unmodulated signal to said IF reference signal.

22. The method of claim 21, wherein producing said fixed IF unmodulated signal comprises:

mixing one of said two fixed IF modulated signals with said in-phase base band signal producing a first IF base band signal, and mixing the other of said fixed IF modulated signals with said quadrature base band signal producing a second IF base band signal; and combining said first IF base band signal and said second IF base band signal to produce said fixed IF unmodulated signal.

23. The method of claim 21, wherein said providing two quadrature signals is providing two quadrature carrier wave signals.

24. The method of claim 23, wherein said providing two quadrature carrier wave signals comprises:

providing a carrier wave signal; and phase shifting said carrier wave signal to produce two quadrature carrier wave signals having the same frequency and differing by approximately ninety degrees.

25. The method of claim 23, wherein said providing two quadrature carrier wave signals comprises:

receiving a reference signal;

comparing said reference signal to a carrier wave signal and producing a control signal to minimize the difference between said reference signal and said carrier wave signal;

producing said carrier wave signal in response to said control signal, wherein said carrier wave signal is compared to said reference signal; and phase shifting said carrier wave signal to produce two quadrature carrier wave signals.

26. The method of claim 23, wherein said providing two quadrature carrier wave signals comprises:

receiving a reference signal;

comparing said reference signal to a carrier wave signal and producing a control signal to minimize the difference between said reference signal and said carrier wave signal; and producing two quadrature carrier wave signals in response to said control signal, wherein one of said two quadrature carrier wave signals is compared with said reference signal.

27. The method of claim 23, wherein said down converting said two quadrature signals to produce two fixed IF modulated signals is down converting said two quadrature carrier wave signals and comprises mixing each of said two quadrature carrier wave signals with a modulated transmit signal produced to phase lock said fixed IF unmodulated signal to said IF reference signal.

28. The method of claim 21, wherein said providing two quadrature signals is providing two quadrature transmit modulated signals.

29. The method of claim 28, further comprising:

providing a transmit modulated signal to phase lock said fixed IF unmodulated signal to said IF reference signal; and phase shifting said transmit modulated signal to produce said two quadrature transmit modulated signals;

wherein said down converting said two quadrature signals to produce two fixed IF modulated signals is down converting said two quadrature transmit modulated signals and comprises mixing each of said two quadrature transmit modulated signals with said carrier wave signal.

* * * * *